US007525236B2

(12) United States Patent
Takeuchi et al.

(10) Patent No.: US 7,525,236 B2
(45) Date of Patent: Apr. 28, 2009

(54) PIEZOELECTRIC ELEMENT UNIT, MANUFACTURING METHOD OF THE SAME, AND LIQUID EJECTING HEAD USING THE SAME

(75) Inventors: Nao Takeuchi, Matsumoto (JP); Satoshi Kasai, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/757,183

(22) Filed: Jun. 1, 2007

(65) Prior Publication Data

US 2007/0279459 A1 Dec. 6, 2007

(30) Foreign Application Priority Data

Jun. 1, 2006 (JP) ............................ 2006-153040

(51) Int. Cl.
*H01L 41/08* (2006.01)

(52) U.S. Cl. ...................................................... 310/328

(58) Field of Classification Search ................. 310/328, 310/366, 365; 347/50

See application file for complete search history.

(56) References Cited

U.S. PATENT DOCUMENTS

| | | | | |
|---|---|---|---|---|
| 6,840,601 | B2 * | 1/2005 | Miyata | 347/70 |
| 7,222,942 | B2 * | 5/2007 | Kawamura | 347/50 |
| 7,239,070 | B2 * | 7/2007 | Shimada et al. | 310/365 |

FOREIGN PATENT DOCUMENTS

| | | | |
|---|---|---|---|
| JP | 07-156404 | | 6/1995 |
| JP | 11-277745 | | 10/1999 |
| JP | 2001-287388 | | 10/2001 |
| JP | 2002-026471 | * | 1/2002 |
| JP | 2003-159795 | | 6/2003 |
| JP | 2003-305842 | | 10/2003 |
| JP | 2005-096235 | | 4/2005 |

* cited by examiner

*Primary Examiner*—Thomas M. Dougherty
*Assistant Examiner*—Karen B Addison
(74) *Attorney, Agent, or Firm*—Workman Nydegger

(57) ABSTRACT

A piezoelectric element unit includes a piezoelectric element group, a fixing plate, and a wiring member. The piezoelectric element group includes an array of piezoelectric elements, each piezoelectric element having an external electrode. A rear portion of the piezoelectric element group is fixed to the fixing plate by polymerization such that a tip end portion of the piezoelectric element group protrudes from a tip end surface of the fixing plate. The wiring member has a wiring terminal that is bonded to the external electrode of each of the piezoelectric elements. In this unit, the piezoelectric element group has a wiring connection surface located opposite to a surface thereof fixed to the fixing plate, the wiring connection surface having a solder-bonding region and a resist application region, the resist application region being located at a rear end side of the solder-bonding region. Also, when the wiring terminal of the wiring member is to be soldered to the solder-bonding region, a solder resist applied to the resist application region is melted, and the wiring member is bonded to the wiring connection surface.

3 Claims, 4 Drawing Sheets

PIEZOELECTRIC ELEMENT UNIT, MANUFACTURING METHOD OF THE SAME, AND LIQUID EJECTING HEAD USING THE SAME

BACKGROUND

1. Technical Field

The present invention generally relates to piezoelectric element units suitable for ejecting liquid droplets such as ink droplets, manufacturing methods of the same, and liquid ejecting heads using the same. In particular, the invention relates to a configuration for soldering a piezoelectric element group to a wiring member that supplies a driving signal to a piezoelectric element included in the group.

2. Related Art

An example of liquid ejection head is an ink jet recording head (hereinafter, merely referred to as a recording head) including a passage unit provided with a pressure chamber, a reservoir, and the like; a piezoelectric element unit disposed at the rear surface of the passage unit and having a plurality of vibrators (elements) that cause a variation in volume of the pressure chamber; and a case having therein a housing space for accommodating the piezoelectric element unit, the tip end thereof being bonded to the passage unit.

In the piezoelectric element unit, for example, an electrode formed on the surface of a piezoelectric element is connected to a film-like flexible cable (a kind of wiring members). The flexible cable is electrically bonded to a wiring substrate that supplies a drive pulse. The drive pulse is supplied to the electrode of the piezoelectric element unit through the flexible cable (e.g., see JP-A-11-277745).

In recent years, this kind of recording head tends to have small components to meet demands on reduction in material cost and densification of components. However, as the components become small, the electrodes and terminals thereof become small. This may reduce the bonding area between these components, and degrade the bonding force therebetween obtained by solder bonding. As a result, particularly at the bonding portion where the electrode of the piezoelectric element is soldered to a terminal of the flexible cable, the flexible cable may be detached due to a bending stress that is generated when the flexible cable is bent during assembly. In addition, in such a piezoelectric element unit, a portion of the unit at a rear end side of the bonding portion for the flexible cable disposed at a tip end side is fixed to a fixing plate for fixing the piezoelectric elements with a UV-curable adhesive or the like. This fixing for reinforcement, however, may not prevent the detachment from occurring at the bonding portion.

SUMMARY

An advantage of some aspects of the invention is to provide a piezoelectric element unit that can secure a sufficient bonding strength at a bonding portion where an electrode of a piezoelectric element group is bonded to a terminal of a wiring member, and prevent the wiring member from being detached during assembly, a manufacturing method of the same, and a liquid ejecting head using the same.

According to an aspect of the invention, a piezoelectric element unit is provided. The unit includes a piezoelectric element group, a fixing plate, and a wiring member. The piezoelectric element group includes an array of piezoelectric elements, each piezoelectric element having an external electrode. A rear portion of the piezoelectric element group is fixed to the fixing plate by polymerization such that a tip end portion of the piezoelectric element group protrudes from a tip end surface of the fixing plate. The wiring member has a wiring terminal that is bonded to the external electrode of each of the piezoelectric elements. In this unit, the piezoelectric element group has a wiring connection surface located opposite to a surface thereof fixed to the fixing plate, the wiring connection surface having a solder-bonding region and a resist application region, the resist application region being located at a rear end side of the solder-bonding region. Also, when the wiring terminal of the wiring member is to be soldered to the solder-bonding region, a solder resist applied to the resist application region is melted, and the wiring member is bonded to the wiring connection surface.

With the above configuration, the resist application region is provided on the piezoelectric element group at the rear end side of the solder-bonding region, and when the wiring terminal of the wiring member is soldered to the solder-bonding region, the solder resist applied to the resist application region is melted, and the wiring member is bonded to the wiring connection surface. Accordingly, the solder resist can be melted and bonded concurrently with the solder bonding. At this time, bonding conditions such as the heating temperature, heating time, load, and the like, for the bonding with the solder resist may be similar to those for the solder bonding. Owing to this, it is not necessary to add a procedure of melting the solder resist and bonding therewith. This may prevent an increase in worker hour.

Also, the wiring member and the piezoelectric element group can be connected not only by solder bonding, but also by bonding with the solder resist. This may increase the bonding strength. Therefore, even if a bending stress is applied to the solder-bonding portion of the wiring member at the tip end side during assembly of an ejecting head, the detachment of the wiring member can be prevented.

Preferably, in the above configuration, the resist application region may extend in an element-alignment direction of the piezoelectric element group. The resist application region may have a width along a short side thereof being no greater than a half of a distance from a rear end of the piezoelectric element group to an end portion of the external electrode to which the wiring terminal is connected. Also, the resist application region may be located on the piezoelectric element group at the rear end side.

With this configuration, the resist application region extends in the element-alignment direction of the piezoelectric element group, has the width along the short side thereof being no greater than a half of the distance from the rear end of the piezoelectric element group to the end portion of the external electrode to which the wiring terminal is connected, and is located on the piezoelectric element group at the rear end side. Accordingly, the rear end portion of the piezoelectric element group possibly causing detachment of the wiring member can be reliably bonded using the solder resist. The solder resist do not flow into gaps between the piezoelectric elements, thereby easily securing a large bonding area of the solder resist. Thus, the bonding strength of the solder-bonding portion between the wiring member and the piezoelectric element group may be increased.

Preferably, in the above configuration, the resist application region may have an excess-resist application region provided at least at one of ends of the resist application region in the element-alignment direction of the piezoelectric element group to protrude and expand from the resist application region toward the end portion of the external electrode to which the wiring terminal is connected.

With this configuration, the resist application region has the excess-resist application region provided at least at one of the ends of the resist application region in the element-alignment direction of the piezoelectric element group to protrude and expand from the resist application region toward the end portion of the external electrode to which the wiring terminal is connected. Accordingly, the bonding strength of the solder-bonding portion at the end portion of the piezoelectric element group in the element-alignment direction, i.e., the bonding strength in the vicinity of one of rear-end corners of the piezoelectric element group can be further increased. This can further reliably prevent the detachment from occurring at the solder-bonding portion in the vicinity of the corner possibly causing the detachment.

According to another aspect of the invention, a liquid ejecting head is provided. The head includes a passage unit and the above-described piezoelectric element unit. The liquid ejection head has a liquid passage continuously arranged from a common liquid chamber to a nozzle opening through a pressure chamber. In the head, deformation of each piezoelectric element causes pressure fluctuation of liquid provided in the pressure chamber so as to eject a liquid droplet from the nozzle opening.

According to still another aspect of the invention, a manufacturing method of a piezoelectric element unit is provided. The unit includes a piezoelectric element group, a fixing plate, and a wiring member. The piezoelectric element group includes an array of piezoelectric elements, each piezoelectric element having an external electrode. A rear portion of the piezoelectric element group is fixed to the fixing plate by polymerization such that a tip end portion of the piezoelectric element group protrudes from a tip end surface of the fixing plate. The wiring member has a wiring terminal that is bonded to the external electrode of each of the piezoelectric elements. The piezoelectric element group has a wiring connection surface located opposite to a surface thereof fixed to the fixing plate. The method includes: providing a solder-bonding region on the wiring connection surface, and a resist application region at a rear end side of the solder-bonding region; and when the wiring terminal of the wiring member is to be soldered to the solder-bonding region, melting a solder resist applied to the resist application region, and bonding the wiring member to the wiring connection surface.

With this manufacturing method, the resist application region is provided on the piezoelectric element group at the rear end side of the solder-bonding region, and when the wiring terminal of the wiring member is bonded to the solder-bonding region, the solder resist applied to the resist application region is melted, and the wiring member is bonded to the wiring connection surface. Accordingly, the solder resist can be melted and bonded concurrently with the solder bonding. At this time, bonding conditions such as the heating temperature, heating time, load, and the like, for the bonding with the solder resist may be similar to those for the solder bonding. Owing to this, it is not necessary to add a procedure of melting the solder resist and bonding therewith. This may prevent an increase in worker hour.

Also, the wiring member and the piezoelectric element group can be connected not only by solder bonding, but also by bonding with the solder resist. This may increase the bonding strength. Therefore, even if a bending stress is applied to the solder-bonding portion of the wiring member at the tip end side during assembly of the ejecting head, the detachment of the wiring member can be prevented. With the above-mentioned configurations, an increase in cost may be prevented, and a yield may be improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
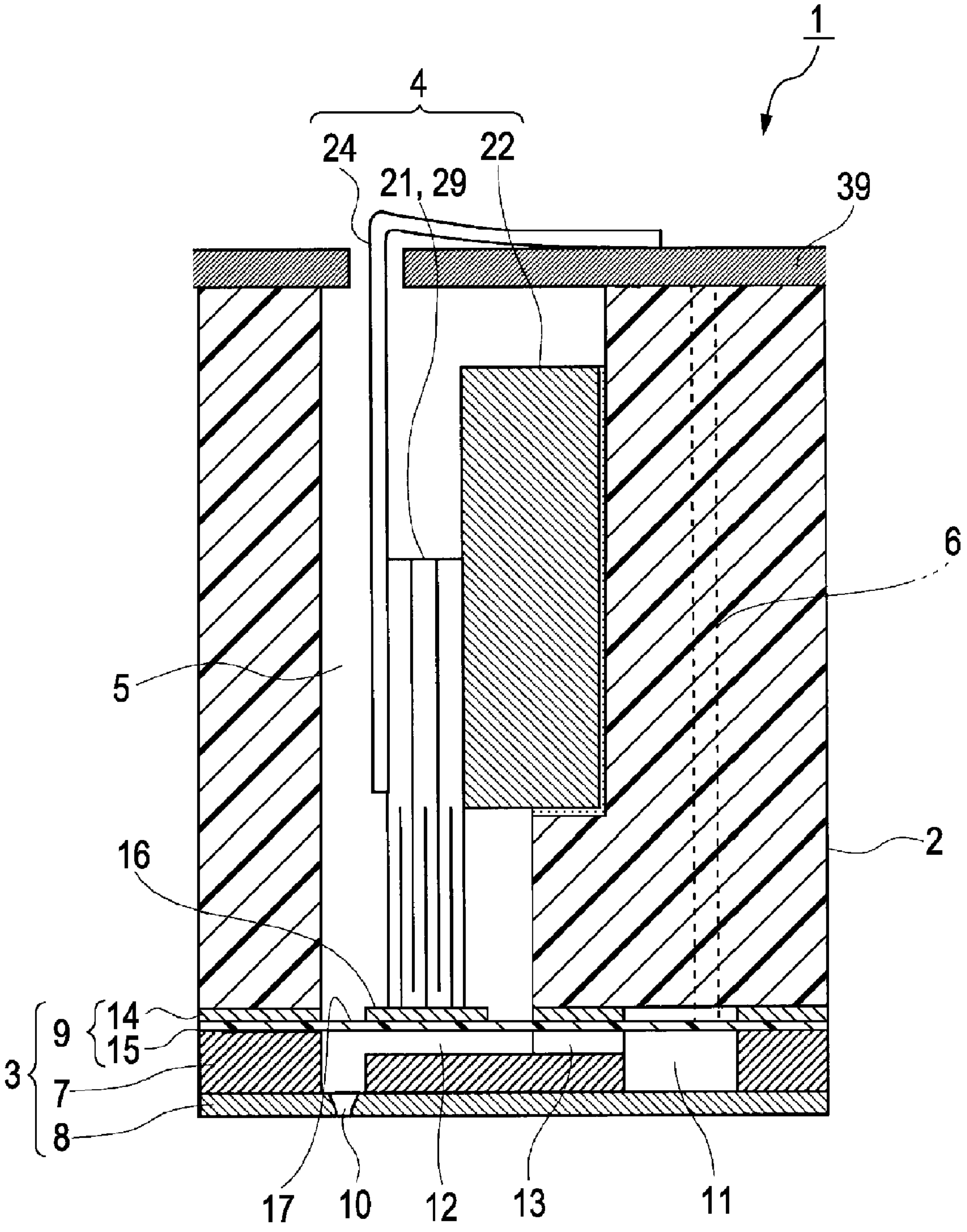
FIG. 1 is an enlarged cross-sectional view showing a piezoelectric element unit and a primary portion of a recording head.
Figure 2:
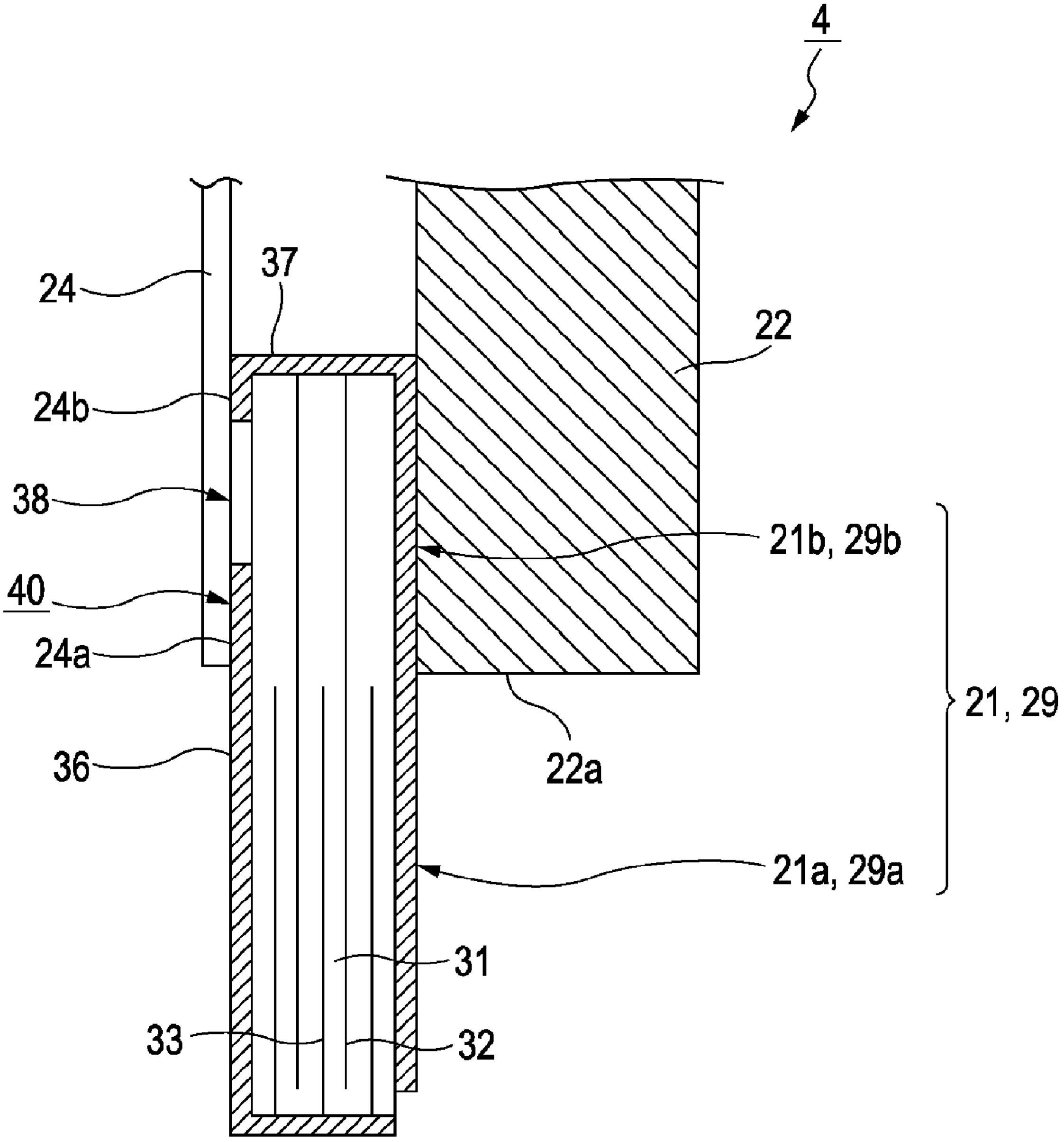
FIG. 2 is an enlarged cross-sectional view showing a primary portion of the piezoelectric element unit.
Figure 3:
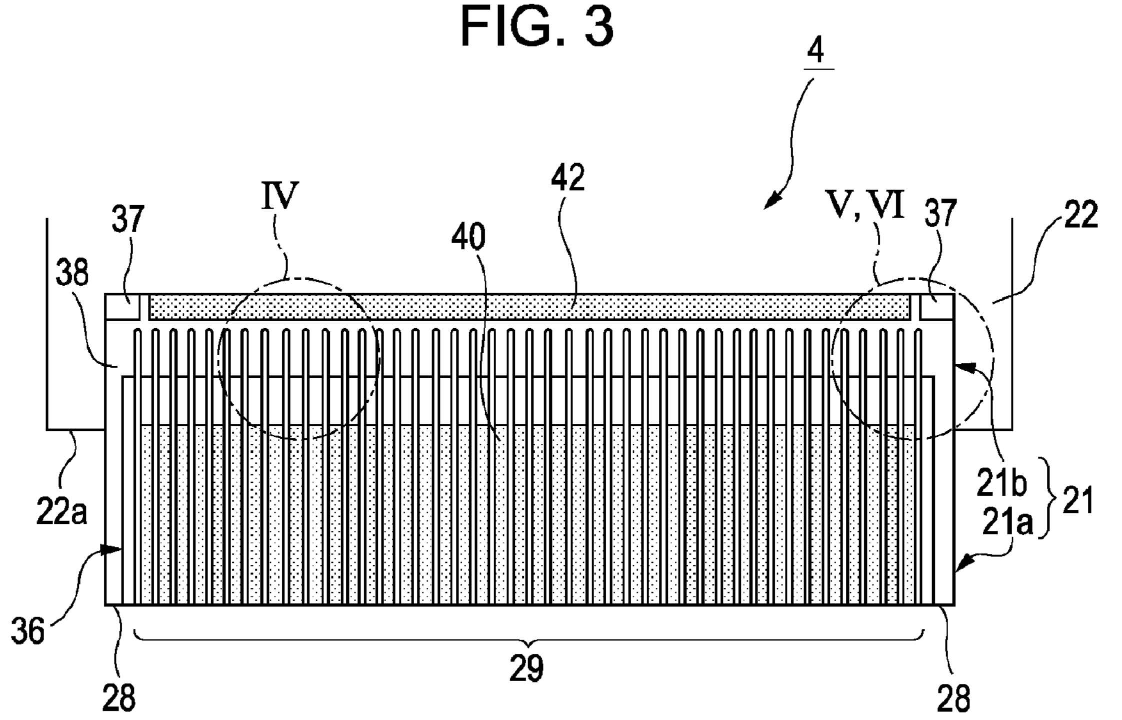
FIG. 3 is a plan view showing the piezoelectric element unit before a flexible cable is bonded.

An embodiment of the invention is described below with reference to the attached drawings. FIG. 1 is an enlarged cross-sectional view showing a primary portion of a recording head. FIG. 2 is an enlarged cross-sectional view showing a primary portion of the piezoelectric element unit. FIG. 3 is a plan view showing the piezoelectric element unit before a flexible is bonded.

A recording head (liquid ejecting head) 1 includes a case 2, a passage unit 3, a piezoelectric element unit 4, and the like. For convenience of the description, the upper side in each drawing is referred to as a rear end side (rear side), and the lower side is referred to as a tip end side (front side).

The case 2 is a block member made of synthetic resin with a tip end and a rear end (base end) of the case 2 being open. The case 2 has therein a rectangular-parallelepiped housing space 5 whose long side extends in a nozzle-array direction, or in an element-alignment direction (described below). The passage unit 3 is bonded at a tip end of the case 2 with an adhesive. The piezoelectric element unit 4 is accommodated in the housing space 5 and fixed thereto with a tip end surface of a piezoelectric element group 21 (described below) being exposed from the opening of the housing space 5 at the tip end side. An ink supply tube 6 is provided beside the housing space 5. A rear end of the ink supply tube 6 communicates with an ink cartridge.

The passage unit 3 includes a passage-forming plate 7, a nozzle plate 8, an elastic plate 9, and the like.

The nozzle plate 8 is a thin plate member, for example, made of a stainless plate, in which a large number of nozzle openings 10 (e.g., 180 openings) are made in arrays at a pitch corresponding to a dot-formation density. The passage-forming plate 7 is laminated on the nozzle plate 8, and involves therein a reservoir 11 to which ink supplied through the ink supply tube 6 flows, a pressure chamber 12 that generates an ink pressure necessary for ejecting the ink from the nozzle openings 10, an ink supply port 13 connecting the reservoir 11 and the pressure chamber 12, and the like. In this embodiment, a silicon wafer is etched to define these portions. The passage-forming plate 7 is not limited to a single member, and may be composed of a plurality of laminated members. The reservoir 11, the pressure chamber 12, and the ink supply port 13 are not limited to be formed as an integrated member, and may be provided as individual members. Also, the material of the passage-forming plate 7 is not limited to silicon.

In this embodiment, the elastic plate 9 has a double structure in which an elastic film 15, e.g., a polymer film made of polyphenylene sulfide (PPS), is laminated on a stainless plate 14. An unnecessary portion of the stainless plate 14, including a portion corresponding to the reservoir 11, is removed by etching etc. to form an island portion 16. The periphery of the island portion 16 is formed only with the elastic film 15 to form an elastic portion 17. The island portion 16 is a block-like profile having a contact surface on the rear surface thereof, to contact a driver element 29 (described below). A large number of island portions 16 are provided at a pitch corresponding to the dot-formation density similarly to the nozzle openings 10. The elastic plate 9 also has an opening (not shown) for allowing the ink supplied from the ink supply tube 6 to flow into the reservoir 11. The opening may be one per array of the pressure chambers 12, or may be plural per array.

The nozzle plate 8 is disposed on one surface of the passage-forming plate 7, and the elastic plate 9 is disposed on the other surface. The passage-forming plate 7 is interposed between the nozzle plate 8 and the elastic plate 9, and these three portions are integrally bonded with an adhesive or the like, to form the passage unit 3. In the passage unit 3, the above-mentioned elastic plate 9 serves as a part of a sealing member that seals the tops of the pressure chamber 12 and the reservoir 11.

The above-mentioned piezoelectric element unit 4 includes a piezoelectric element group 21, a fixing plate 22 made of a stainless plate, and a flexible cable 24 (a kind of wiring members according to the embodiment of the invention) connected to external electrodes of the piezoelectric element group 21 (described below). As shown in FIGS. 2 and 3, the piezoelectric element group 21 has piezoelectric elements arranged in a comb-like form, a free-end portion 21*a* thereof provided at the tip end side protrudes from a tip-end surface 22*a* of the fixing plate 22, and a rear portion (fixed end) 21*b* thereof is fixed to the fixing plate 22 by polymerization. The piezoelectric element group 21 includes dummy elements 28 disposed at both ends in a piezoelectric element-alignment direction (plane direction), and a plurality of driver elements 29 disposed between the dummy elements 28. The driver elements 29 are piezoelectric elements related to ejection of ink droplets. The driver elements 29 are cut into needle-like portions each having an extremely small width, for instance, ranging from 50 to 100 μm. The dummy elements 28 are piezoelectric elements not related to the ejection of the ink droplets. The dummy elements 28 are provided for determining the position of the piezoelectric element unit 4 in the case 2. In this embodiment, the driver elements 29 of the piezoelectric element group 21 are piezoelectric elements that provide vibration in an element-extending direction (in a direction orthogonal to the element-alignment direction) namely the driver elements 29 are piezoelectric elements providing length-extension mode vibration. The details of the piezoelectric element unit 4 and its manufacturing method are described below.

As shown in FIG. 2, in the driver elements 29, common internal electrodes 32 and individual internal electrodes 33 are alternately laminated with piezoelectric materials 31 interposed therebetween. The common internal electrodes 32 are electrodes set to the same electric potential level for all driver elements 29, whereas the individual internal electrodes 33 are electrodes set to electric potential levels corresponding to the driver elements 29, respectively. The driver elements 29 have a free-end portion 29*a* which is substantially a half or two-thirds portion of the driver elements 29 extending from the tip end in the element-extending direction (in a direction orthogonal to a lamination direction); and a rear portion (fixed end) 29*b* which is the residual portion and is bonded to the fixing plate 22. That is, the driver elements 29 are fixed in a cantilevered manner such that the tip end portion thereof protrudes from the tip-end surface 22*a* of the fixing plate 22.

In the free-end portion 29*a* of the driver elements 29, an active region (overlap portion) is provided in which the common internal electrodes 32 and the individual internal electrodes 33 are overlapped. When a potential difference is applied to the internal electrodes 32 and 33, or the internal electrodes 32 and 33 are discharged, the piezoelectric materials 31 in the active region are deformed (activated) and displaced in the element-extending direction, causing expansion and contraction thereof. Base ends of the common internal electrodes 32 communicate with common external electrodes 37 at a rear end surface of the driver elements 29. Tip ends of the individual internal electrodes 33 communicate with individual external electrodes 36 at a tip end surface of the driver elements 29. The individual external electrodes 36 are external electrodes for establishing continuity between the individual internal electrodes 33 and individual wiring terminals 24*a* provided on the flexible cable 24 at the tip end side. The common external electrodes 37 are external electrodes for establishing continuity between the common internal electrodes 32 and common wiring terminals 24*b* provided on a portion of the flexible cable 24 at the rear end side of the individual wiring terminals 24*a*. The basic structure of the dummy elements 28 provided on both sides of the driver elements 29 is similar to that of the driver elements 29 except that the dummy elements 28 are not connected to the individual wiring terminals 24*a*. Accordingly, no drive pulse is supplied to the dummy elements 28, and thus expansion or contraction does not occur.

The tip end portion of the flexible cable 24 is disposed at a wiring connection surface (front surface) 38 located opposite to a fixing-plate bonding surface where the rear portion (fixed end) 21*b* of the piezoelectric element group 21 is bonded to the fixing plate 22. Accordingly, the individual wiring terminals 24*a* and the common wiring terminals 24*b* of the flexible cable 24 are electrically connected to the individual external electrodes 36 and the common external electrodes 37, respectively. Since the portion of the flexible cable 24 at the rear end side is electrically connected to a wiring substrate 39 that supplies a drive pulse, the drive pulse is supplied to the electrodes 33 and 36 through the flexible cable 24 (see FIG. 1).

As shown in FIG. 1, in a state where the piezoelectric element unit 4 is mounted to the recording head 1, the tip end surface of the driver elements 29 of the piezoelectric element unit 4 contacts the rear surface of the island portion 16 of the elastic plate 9, and the tip end surface and the rear surface are bonded with an adhesive.

When the drive pulse is supplied to the driver elements 29, the driver elements 29 expand or contract in the element-extending direction, causing the elastic film 15 of the elastic portions 17 to be deformed in a front-rear direction. As the elastic portions 17 move in the front-rear direction, the pressure chambers 12 expand or contract, and vary in volume. To eject ink droplets from the nozzle openings 10, driving signals are selectively applied to the driver elements 29 that eject ink droplets, and for instance, the corresponding pressure chambers 12 once expand, and then contract. Accordingly, the expansion of the pressure chambers 12 allow ink in the reservoir 11 to flow into the pressure chambers 12, and the contraction of the pressure chambers 12 increase the pressure of the ink in the pressure chambers 12. Due to this, the ink pushed out from the nozzle openings 10 is ejected as ink droplets.

Next, the piezoelectric element unit 4 according to this embodiment and its manufacturing method are described.

Figure 4:
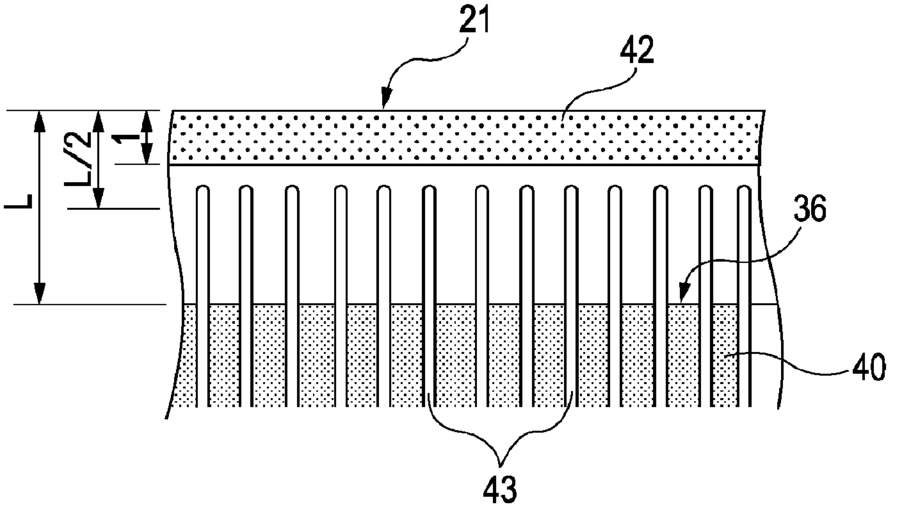
FIG. 4 is an enlarged view showing a region IV in FIG. 3.
Figure 5:
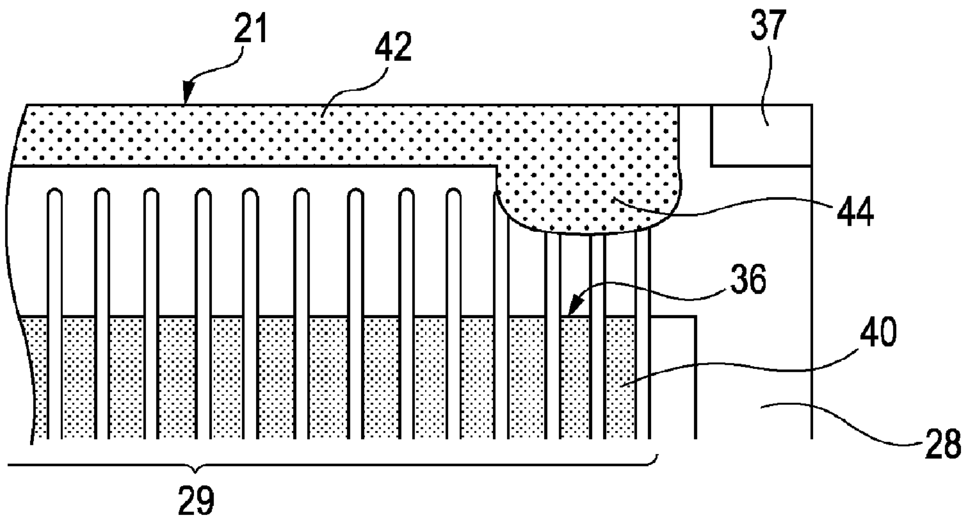
FIG. 5 is an enlarged view showing a region V in FIG. 3.
Figure 6:
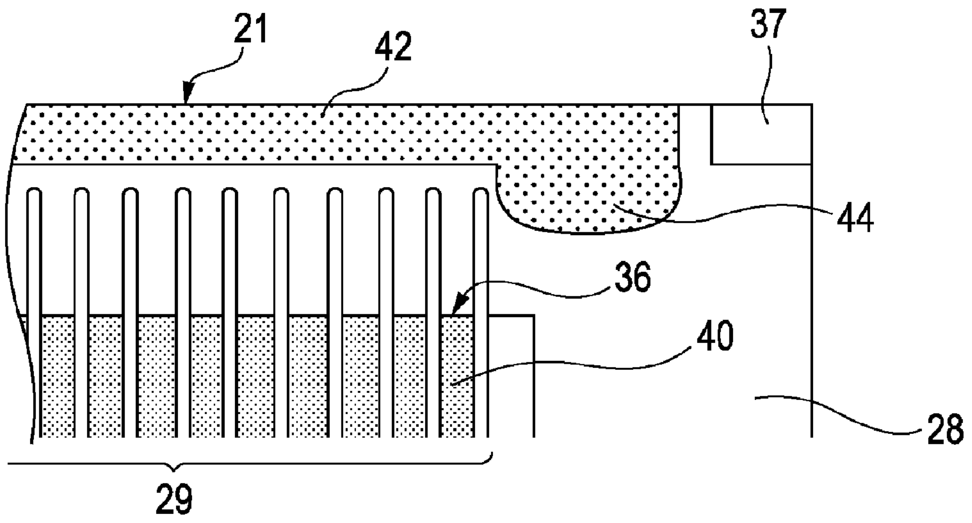
FIG. 6 is another enlarged view showing a region VI in FIG. 3.

FIG. 4 is an enlarged view showing a region IV in FIG. 3. FIG. 5 is an enlarged view showing a region V in FIG. 3. FIG. 6 is an enlarged view showing a modification of the region VI in FIG. 3.

As described above, the piezoelectric element unit 4 of this embodiment includes the fixing plate 22 made of a metal plate of stainless or other material, the piezoelectric element group 21 whose rear portion is fixed to the fixing plate 22 by polymerization, and the flexible cable 24 electrically connected to the wiring connection surface 38 of the piezoelectric element group 21. The flexible cable 24 is formed such that a metal foil made of tin or the like exhibiting good wettability is attached to a base material made of a flexible electrical insulating material such as a polyimide film, to define the wiring terminals 24*a* and 24*b*. The surfaces of the individual wiring terminals 24*a* and the common wiring terminals 24*b* of the flexible cable 24 are treated by solder plating, to be connected to the individual external electrodes 36 and the common external electrodes 37 of the piezoelectric element group 21, respectively. The individual wiring terminals 24*a* are aligned on the flexible cable 24 at the tip end side to respectively correspond to the individual external electrodes 36 of the driver elements 29 of the piezoelectric element group 21. The common wiring terminals 24*b* are provided on the flexible cable 24 on both sides in the alignment direction of the individual wiring terminals 24*a*, and at the rear end side of the individual wiring terminals 24*a*. The common wiring terminals 24*b* are connected to the corresponding common external electrodes 37 of the piezoelectric element group 21, respectively, to be adjusted to a ground potential.

As shown in FIG. 2, the external electrodes 36 and 37 are formed by depositing or sputtering using a conductive material, over the surfaces of the piezoelectric element group 21 except its side surfaces, i.e., the external electrodes 36 and 37 extend on the wiring connection surface 38, the tip end surface, the rear end surface, and the fixing-plate bonding surface. The individual external electrodes 36 are external electrodes extending from the tip end surface to the wiring connection surface 38 of the driver elements 29 (piezoelectric element group 21). At the side of the wiring connection surface 38, the individual external electrodes 36 are formed continuously from the tip end to a portion near the rear end of the driver elements 29. An end portion of the individual external electrodes 36 located near the rear end of the driver elements 29 is electrically connected to the individual wiring terminals 24*a* of the flexible cable 24 by solder bonding, thereby establishing continuity between the individual internal electrodes 33 and the flexible cable 24. A solder-bonding region 40 to solder the individual wiring terminals 24*a* and the individual external electrodes 36 is provided at the surface of the piezoelectric element group 21 to which the flexible cable 24 is bonded, i.e., at the wiring connection surface 38 located opposite to the surface of the piezoelectric element group 21 fixed to the fixing plate 22. In particular, as shown in FIGS. 2 and 3, the solder-bonding region 40 is an horizontally extending, band-like region for connecting the individual wiring terminals 24*a* of the flexible cable 24, the region 40 being provided at the end portion of the individual external electrodes 36 of the driver elements 29 of the piezoelectric element group 21 at the rear end side.

The common external electrodes 37 are external electrodes continuously extending from the wiring connection surface 38 of the piezoelectric element group 21 (driver elements 29) to the fixing-plate bonding surface. At the side of the wiring connection surface 38, the common external electrodes 37 are formed continuously toward the rear end surface of the piezoelectric element group 21 from a position, which is distant from the end portion of the individual external electrodes 36 (solder-bonding region 40) toward the rear end of the piezoelectric element group 21. In particular, the common external electrodes 37 are formed over both corners at the rear portion 21*b* in a substantially rectangular shape to be slightly distant from the end portion of the individual external electrodes 36 connected to the individual wiring terminals 24*a* toward the rear end of the piezoelectric element group 21. Similarly to the individual external electrodes 36, the common external electrodes 37 are electrically connected to the corresponding common wiring terminals 24*b* of the flexible cable 24 by solder bonding, thereby establishing continuity between the common internal electrodes 32 and the flexible cable 24.

To bond the flexible cable 24 and the piezoelectric element group 21, while the individual wiring terminals 24*a* are superposed on the individual external electrodes 36, and the common wiring terminals 24*b* are superposed on the common external electrodes 37, a heat tool is pressed to the surface of the flexible cable 24 to solder these components at a time. In this embodiment, a resist application region 42 extending in the element-alignment direction is provided at a portion of the piezoelectric element group 21 at the rear end side of the solder-bonding region 40. When the individual wiring terminals 24*a* of the flexible cable 24 are soldered to the solder-bonding region 40, a solder resist applied to the resist application region 42 is melted by the heat tool which is used for solder bonding, and thus the flexible cable 24 is bonded to the wiring connection surface 38 of the piezoelectric element group 21.

As described above, for the solder bonding, since the solder resist applied to the resist application region 42 is melted, and the flexible cable 24 is bonded to the wiring connection surface 38 of the piezoelectric element group 21, the flexible cable 24 can be bonded to the wiring connection surface 38 of the piezoelectric element group 21 by melting the solder resist concurrently with the solder bonding. At this time, bonding conditions such as the heating temperature, heating time, load, and the like, for the bonding with the solder resist may be similar to those for the solder bonding. Accordingly, it is not necessary to add a procedure of melting the solder resist and bonding therewith. This may prevent an increase in worker hour, thus preventing an increase in cost.

Also, the flexible cable 24 and the piezoelectric element group 21 can be connected not only by solder bonding, but also by bonding with the solder resist. This may increase bonding strength. Even when the wiring terminals 24*a* and 24*b* of the flexible cable 24 and the external electrodes 36 and 37 of the piezoelectric element group 21 are reduced in size, and this causes the solder-bonding area to be reduced in size, the additional bonding with the solder resist applied to the solder-bonding portion may provide sufficient bonding strength. As a result, even if bending the flexible cable 24 at the rear end side causes a bending stress to be applied to the solder-bonding portion at the tip end side, the flexible cable 24 can be prevented from being detached from the solder-bonding portion. Therefore, manufacturing the recording head 1 with this manufacturing method may improve the yield.

In this embodiment, as shown in FIG. 4, the resist application region 42 continuously extends in the element-alignment direction of the piezoelectric element group 21. The resist application region 42 has a width in the element-extending direction orthogonal to the element-alignment direction of the piezoelectric element group 21, namely, a width 1 along the sort side thereof being no greater than a half of a distance L (L/2), the distance L extending from the rear end of the piezoelectric element group 21 to the end portion of the individual external electrodes 36 to which the individual wiring terminals 24*a* are connected. The resist application region 42 is located on the piezoelectric element group 21 at the rear end side. In particular, it is located between the common external electrodes 37 disposed at both rear-end corners of the piezoelectric element group 21. With such an arrangement of the resist application region 42, the rear end portion of the piezoelectric element group 21 possibly causing the detachment of the flexible cable 24 can be reliably bonded using the solder resist. The rear end portion of the piezoelectric element group 21 is flat because grooves 43 by which piezoelectric elements are divided are not provided. Accordingly, the solder resist do not flow into the grooves 43 between the piezoelectric elements, thereby easily securing a large bonding area of the solder resist. Thus, the bonding strength of the solder-bonding portion between the flexible cable 24 and the piezoelectric element group 21 may be increased. This may prevent further reliably the flexible cable 24 from being detached during assembly of the recording head 1. In addition, since the resist application region 42 is disposed between the common external electrodes 37 located at both rear-end corners of the piezoelectric element group 21 possibly causing the detachment, the detachment can be prevented from occurring at the solder-bonding portion where the common external electrodes 37 and the common wiring terminals 24*b* are soldered.

As shown in FIG. 5, the resist application region 42 has an excess-resist application region 44 at least at one of the ends of the resist application region 42 in the element-alignment direction of the piezoelectric element group 21 (i.e., near one of the rear-end corners of the piezoelectric element group 21, or near one of the common external electrodes 37). The excess-resist application region 44 protrudes and expands from the resist application region 42 toward the end portion of the individual external electrodes 36 to which the individual wiring terminals 24*a* are connected. Since the excess-resist application region 44 is formed as an expanding portion of the resist application region 42 near the rear-end corner of the piezoelectric element group 21 possibly causing the detachment of the flexible cable 24, the bonding strength of the solder-bonding portion near this corner may be increased. Accordingly, the detachment can be further reliably prevented from occurring at the solder-bonding portion where the common external electrodes 37 is bonded to the common wiring terminals 24*b*. This may prevent further reliably the flexible cable 24 from being detached during the assembly of the recording head 1.

As described above, the excess-resist application region 44 is exemplarily provided at a region facing the rear end portion of the driver elements 29 of the piezoelectric element group 21, namely, at a region in the rear portion 29*b* of the driver elements 29 to protrude and expand from the resist application region 42 toward the end portion (toward the free-end portion 29*a*) of the individual external electrodes 36 to which the individual wiring terminals 24*a* are connected. In this case, the excess-resist application region 44 possibly restrains the displacement of the driver elements 29. Therefore, as shown in FIG. 6, the width of the dummy element 28 in the element-alignment direction of the piezoelectric element group 21 may be increased (to have an enlarged width), so that the excess-resist application region 44 formed between the common external electrode 37 and the resist application region 42 is formed at the enlarged width region facing the rear end portion of the dummy element 28, and thus, the excess-resist application region 44 does not interfere with the driver element 29.

In a case where the solder resist is applied to the resist application region 42 with a needle, the excess-resist application region 44 may be provided as a start point or an end point of the application. This case can also provide advantages similar to those described above.

The invention is not limited to the above embodiment, and may include various modifications. While the resist application region 42 is provided on the wiring connection surface 38 of the piezoelectric element group 21 as a region continuously extending in the element-alignment direction in the above embodiment, it is not limited thereto. For example, the solder resist may be applied in a form of staggered dots. That is, the resist application region 42 may be applied in any form as long as it is disposed on the piezoelectric element group 21 at the rear end side of the solder-bonding region 40 and the sufficient bonding strength is provided for preventing the detachment from occurring at the solder-bonding portion where the external electrodes of the piezoelectric element group 21 is bonded to the wiring terminals of the flexible cable 24. Alternatively, the resist application region 42 may be provided at a connection surface of the flexible cable 24, the surface being bonded to the wiring connection surface 38 of the piezoelectric element group 21.

What is claimed is:

1. A piezoelectric element unit comprising:

a piezoelectric element group including an array of piezoelectric elements, each piezoelectric element having an external electrode;

a fixing plate to which a portion of the rear surface of the piezoelectric element group is fixed by polymerization such that a end portion of the piezoelectric element group protrudes from an surface of the fixing plate; and a wiring member having a wiring terminal that is bonded to an end portion of the external electrode of each of the piezoelectric elements, wherein the piezoelectric element group has a wiring connection surface located opposite to the surface fixed to the fixing plate, the wiring connection surface having a solder-bonding region and a resist application region, the resist application region being located at a rear end side of the solder-bonding region, wherein when the wiring terminal of the wiring member is soldered to the solder-bonding region, a solder resist applied to the resist application region is melted, and the wiring member is bonded to the wiring connection surface, and wherein the resist application region has an excess-resist application region provided at least at one end of the resist application region which protrudes in the direction that the array of piezoelectric elements are aligned in the piezoelectric element group toward the end portion of the external electrode to which the wiring terminal is connected.

2. The piezoelectric element unit according to claim 1, wherein the resist application region extends in an element alignment direction of the piezoelectric element group, has a width along a short side thereof being no greater than a half of a distance from a rear end of the piezoelectric element group to an end portion of the external electrode to which the wiring terminal is connected, and is located on the piezoelectric element group at the rear end side.

3. A liquid ejecting head comprising:

a passage unit having a liquid passage continuously arranged from a common liquid chamber to a nozzle opening through a pressure chamber; and the piezoelectric element unit described in claim 1, wherein deformation of each of the piezoelectric elements causes pressure fluctuation of liquid provided In the pressure chamber so as to eject a liquid droplet from the nozzle opening.

* * * * *